United States Patent
Lee et al.

(10) Patent No.: US 9,666,687 B1
(45) Date of Patent: May 30, 2017

(54) METHOD FOR FORMING SEMICONDUCTOR STRUCTURE

(71) Applicant: UNITED MICROELECTRONICS CORP., Hsin-Chu (TW)

(72) Inventors: Hao-Ming Lee, Taichung (TW); Sheng-Hao Lin, Hsinchu County (TW); Huai-Tzu Chiang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/187,795

(22) Filed: Jun. 21, 2016

(30) Foreign Application Priority Data

May 23, 2016 (CN) .......................... 2016 1 0344090

(51) Int. Cl.
*H01L 21/336* (2006.01)
*H01L 29/66* (2006.01)
*H01L 29/06* (2006.01)
*H01L 21/311* (2006.01)

(52) U.S. Cl.
CPC .. *H01L 29/66666* (2013.01); *H01L 21/31111* (2013.01); *H01L 21/31144* (2013.01); *H01L 29/0649* (2013.01); *H01L 29/0676* (2013.01); *H01L 29/6653* (2013.01); *H01L 29/6656* (2013.01)

(58) Field of Classification Search
None
See application file for complete search history.

(56) References Cited

U.S. PATENT DOCUMENTS

| 6,667,237 B1 * | 12/2003 | Metzler | B81C 1/00404 257/E21.035 |
| 8,211,803 B2 * | 7/2012 | Sandhu | H01L 21/0337 257/E21.038 |
| 2008/0311753 A1 * | 12/2008 | Zheng | H01L 21/28132 438/694 |
| 2011/0003469 A1 * | 1/2011 | Kewley | H01L 21/0337 438/591 |
| 2011/0312184 A1 * | 12/2011 | Lee | H01L 21/0338 438/696 |
| 2012/0061641 A1 * | 3/2012 | Seong | H01L 27/156 257/13 |
| 2015/0179843 A1 * | 6/2015 | Kanematsu | H01L 31/035218 136/255 |
| 2015/0348848 A1 | 12/2015 | Fu | |

\* cited by examiner

*Primary Examiner* — Duy T Nguyen
*Assistant Examiner* — Mounir Amer
(74) *Attorney, Agent, or Firm* — Winston Hsu; Scott Margo

(57) ABSTRACT

The present invention provides a method for forming a semiconductor structure, at least including the following steps: first, four sacrificial patterns are formed on a substrate, and a plurality of spacers are then formed surrounding each sacrificial pattern. Next, the four sacrificial patterns are removed, and a photoresist layer is formed between each spacer, covering parts of each spacer. Afterwards, a first etching process is performed to partially remove each spacer, and the photoresist layer is then removed, and a second etching process is then performed, to remove each spacer again, and to form four nanowire hard masks.

18 Claims, 5 Drawing Sheets

METHOD FOR FORMING SEMICONDUCTOR STRUCTURE

BACKGROUND OF THE INVENTION

1. Field of the Invention

The present invention relates to semiconductor technology, and in particular, to a method for forming a nano size vertical nanowire structure.

2. Description of the Prior Art

Vertical transistors are being researched recently. In a vertical transistor, a vertical column, which may be a vertical nano-wire formed of a semiconductor material, is formed over a substrate, which may be a bulk semiconductor wafer or a semiconductor-on-insulator (SOI) wafer. A gate dielectric and a gate electrode are formed to encircle the nanowire, with the encircled portion of the nanowire forming the channel of the respective vertical transistor. A source and a drain are formed, with one underlying the channel, and the other overlying the channel. The vertical transistor has a gate-all-around structure since the gate may fully encircle the channel. With the all-around gate structure, the drive current of the vertical transistor is high and short-channel effects are minimized.

SUMMARY OF THE INVENTION

The present invention provides a method for forming a semiconductor structure, at least includes the following steps: first, four sacrificial patterns are formed on a substrate, a plurality of spacers are then formed surrounding each sacrificial pattern. Next, the four sacrificial patterns are removed, and a photoresist layer is formed between each spacer, covering parts of each spacer. Afterwards, a first etching process is performed to partially remove each spacer, and the photoresist layer is then removed, and a second etching process is then performed, to remove each spacer again, and to form four nanowire hard masks.

The key feature of the present invention is using the current 14 nm manufacturing process technology to form the nanowire group (each one nanowire group includes four nanowire structures), in which the size or the gaps of the nanowire structures is much smaller than the critical dimension of 14 nm manufacturing process technology. In this invention, it is not necessary to use other complex or high cost processes (such as E-beam), but still trims the size of the nanowires easily.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
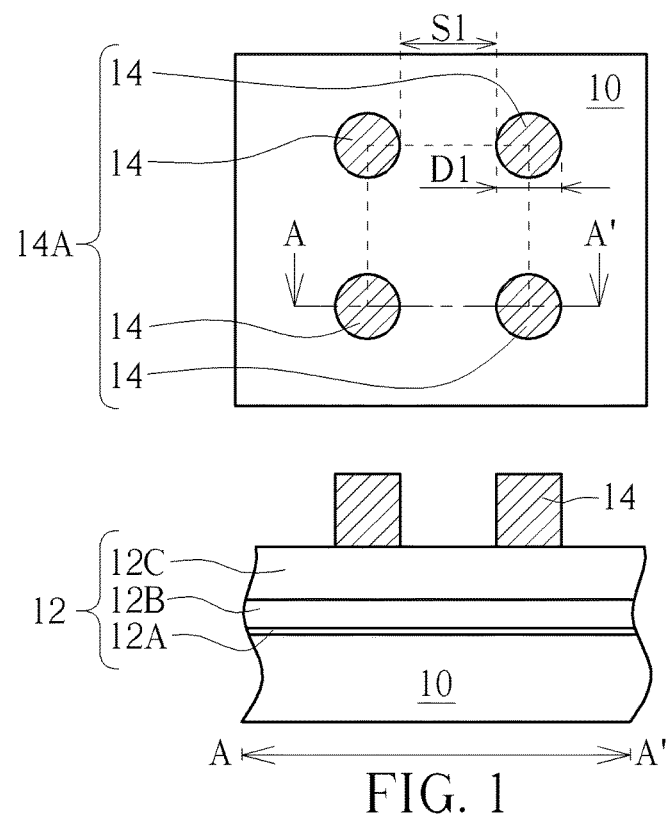
FIG. 1 shows the top view diagram and the cross section diagram of four sacrificial patterns are formed on a substrate.

As shown in FIG. 1, the upper portion of FIG. 1 shows the top view diagram having four sacrificial patterns formed on a substrate, and the lower portion of FIG. 1 shows the cross section diagram according to the cross section line A-A' of the upper portion of FIG. 1. First of all, a substrate 10 is provided, and the substrate 10 may include a silicon substrate, a silicon-on-insulator (SOI) substrate or other suitable semiconductor substrates. In this embodiment, take the silicon substrate as an example, but the invention is not limited thereto. Next, a cap layer 12 is formed on the substrate 10, and the cap layer 12 preferably includes a multiple layer structure, such as a stacked structure having a silicon oxide layer 12A, a silicon nitride layer 12B and a silicon oxide layer 12C from bottom to top, but not limited thereto. The material of the cap layer 12 can be adjusted according to actual requirements. Afterwards, a plurality of sacrificial patterns are formed, such as at least four sacrificial patterns 14 are formed on the cap layer 12. It is noteworthy that in this embodiment, every four sacrificial patterns 14 are defined as one pattern group 14A. In other words, every one pattern group 14A includes four sacrificial patterns 14, the four sacrificial patterns 14 are formed simultaneously, and they are arranged in an array. More precisely, the central points of these four sacrificial patterns 14 are disposed on the four corners of one square (shown as the dotted line shown in FIG. 1) respectively. Of course, the semiconductor structure of the present invention may further include other pattern groups (not shown), and each of the rest of the pattern groups also include four sacrificial patterns, and the four sacrificial pattern are formed simultaneously too.

In another embodiment of the present invention, one pattern group may include other numbers of sacrificial patterns, such as three sacrificial patterns or five sacrificial patterns. However, in this embodiment, one pattern group includes four sacrificial patterns, having the advantage such as a simple pattern, and being easy to combine with other adjacent pattern groups, so the following paragraph still takes the pattern group with four sacrificial patterns as an example.

The four sacrificial patterns 14 are preferably cylinder structures and they have identical sizes, and the four cylinder-shaped sacrificial patterns 14 can be formed through a single or double photo-etching process directly with a photo mask (not shown). Considering the critical dimension under the current 14 nm manufacturing process technology, the diameter D1 of each of the sacrificial patterns 14 is about 30-35 nanometers, such as 32 nanometers. And the distance S1 between two adjacent sacrificial patterns 14 is about 48-55 nanometers, such as 52 nanometers. The size range mentioned above means under the 14 nm manufacturing process technology, one pattern is formed by the photolithography process. If the size (such as the diameter or the gap between two patterns) of the pattern is smaller than the range mentioned above (the critical dimension), it's very likely to lead the pattern formed to have failure. In other words, the size and the gaps of the four sacrificial patterns 14 mentioned above are the minimum size or the minimum gaps of the four sacrificial patterns 14 that are formed by the photolithography process under the 14 nm manufacturing process technology.

Figure 2:
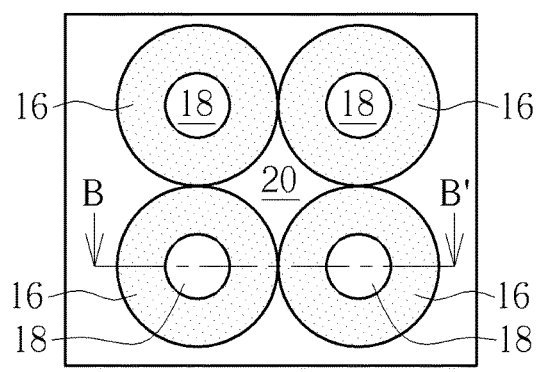
FIG. 2 shows the top view diagram and the cross section diagram after four spacers are formed.
Figure 2:
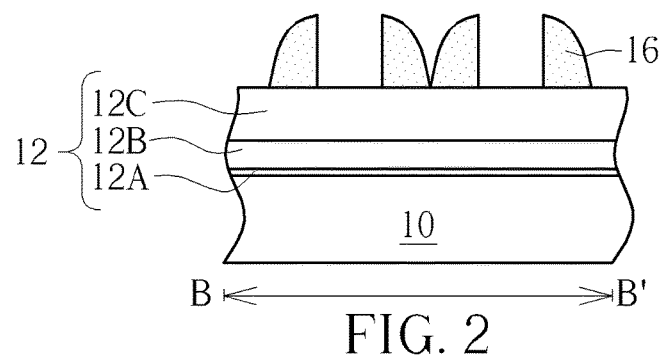

Afterwards, as shown in FIG. 2, the upper portion of FIG. 2 shows the top view diagram after four spacers are formed, the lower portion of FIG. 2 shows the cross section diagram according to the cross section line B-B' of the upper portion of FIG. 2. A plurality of spacers 16 are formed surrounding the four sacrificial patterns 14. It is noteworthy since the material of the sacrificial patterns 14 includes, for example, amorphous silicon or polysilicon, and the material of the spacers 16 includes, for example, silicon nitride, silicon oxide or nitrogen-doped silicon carbide (SiCN), the material of spacers 16 should be adjusted to make the silicon oxide layer 12C, the sacrificial patterns 14 and the spacers 16 have etching selectivity (they have different etching rates while using a same etchant). Besides, since each sacrificial pattern 14 is preferably a cylinder structure, the spacer 16 surrounds each sacrificial pattern 14, and each spacer 16 is an annular-shaped structure. In addition, the edge of each one spacer 16 contacts directly and tangentially to the edge of the other one spacer 16. Afterwards, the sacrificial patterns 14 are removed. Here the central region of each spacer 16 (it was also the region where the sacrificial patterns 14 are disposed) is defined as a blank region 18, and the region surrounded by the spacers 16 is defined as a star-shaped region 20.

Figure 3:
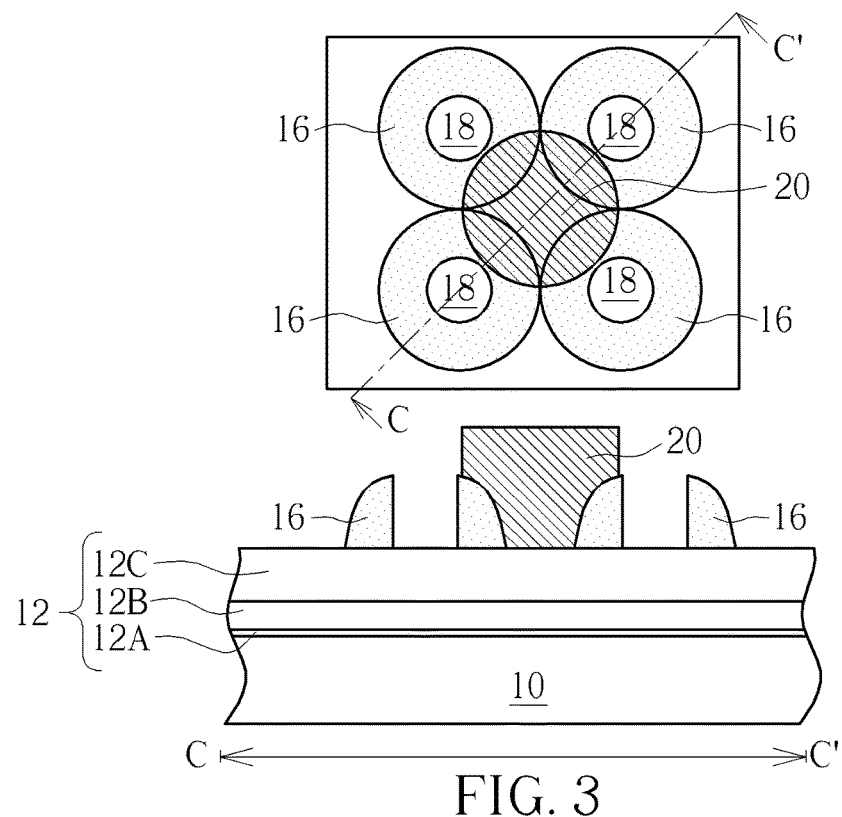
FIG. 3 shows the top view diagram and the cross section diagram after a photoresist layer is formed.

As shown in FIG. 3, the upper portion of FIG. 3 shows the top view diagram after a photoresist layer is formed, the lower portion of FIG. 3 shows the cross section diagram according to the cross section line C-C' of the upper portion of FIG. 3. A photoresist layer 22 is formed on the substrate 10, covering parts of the cap layer 12 and parts of the spacers 16. Preferably, the photoresist layer 22 entirely covers the star-shaped region 20 and partially covers the spacers 16, but the photoresist layer 22 does not cover the blank region 18. However, the present invention is not limited thereto. In another embodiment of the present invention, the size of the photoresist layer 22 can be adjusted, and it may smaller than the size mentioned above, so the photoresist layer 22 may only cover parts of the star-shaped region 20 and parts of the spacers 16, or the size may be larger than the size mentioned above, so the photoresist layer 22 may entirely cover the star-shaped region 20 and parts of the spacers 16, and further covers parts of the blank region 18, and this should also be within the scope of the present invention.

Figure 4:
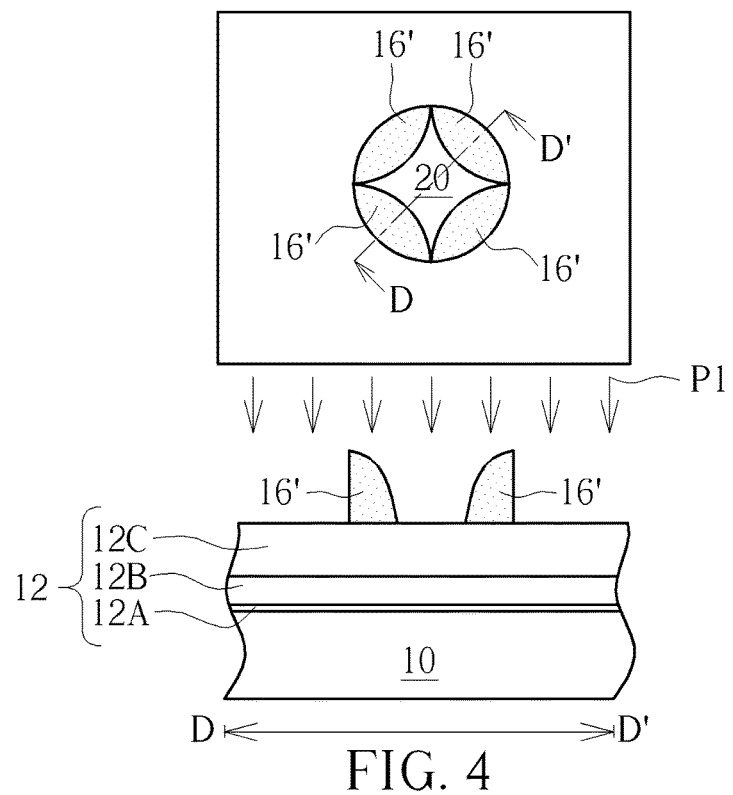
FIG. 4 shows the top view diagram and the cross section diagram after a first etching process is performed.

As shown in FIG. 4, the upper portion of FIG. 4 shows the top view diagram after a first etching process is performed, the lower portion of FIG. 4 shows the cross section diagram according to the cross section line D-D' of the upper portion of FIG. 4. A first etching process P1 is performed, to remove the spacers 16 that are not covered by the photoresist layer 22, and the rest of the spacers (the spacers that are covered by the photoresist layer 22) are defined as the spacers 16'. Next, the photoresist layer 22 is then removed.

Figure 5:
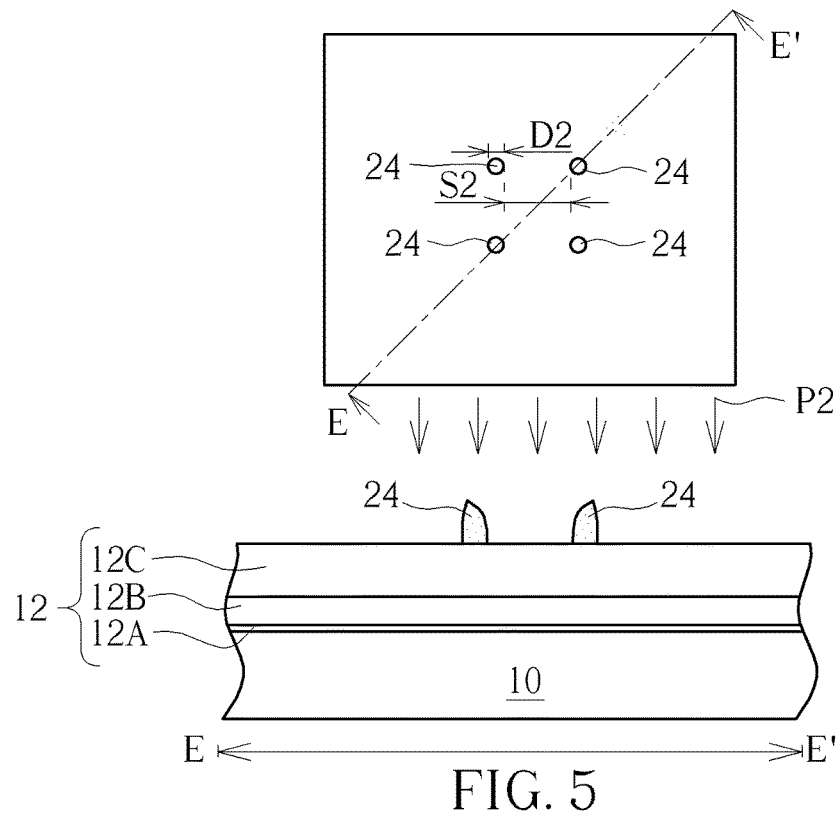
FIG. 5 shows the top view diagram and the cross section diagram after a second etching process is performed.

As shown in FIG. 5, the upper portion of FIG. 5 shows the top view diagram after a second etching process is performed, the lower portion of FIG. 5 shows the cross section diagram according to the cross section line E-E' of the upper portion of FIG. 5. A second etching process P2 is performed, such as a wet etching process, to etch the spacer 16', and so as to form four nanowire hard masks 24. Each nanowire hard mask 24 is preferably a cylinder structure. In this embodiment, the second etching process P2 may include the step for soaking the semiconductor structure in hot phosphoric acid. Furthermore, the second etching process P2 may include multiple etching process steps, by adjusting the parameters such as the temperature of the etchant, the concentration or the etching time of each step, to control the size of each nanowire hard mask 24. In this embodiment, the diameter D2 of each nanowire hard mask 24 is about 8-12 nanometers, such as 10 nanometers, and the distance (gap) S2 between two adjacent nanowire hard masks 24 is about 23-28 nanometers, such as 26 nanometers.

Figure 6:
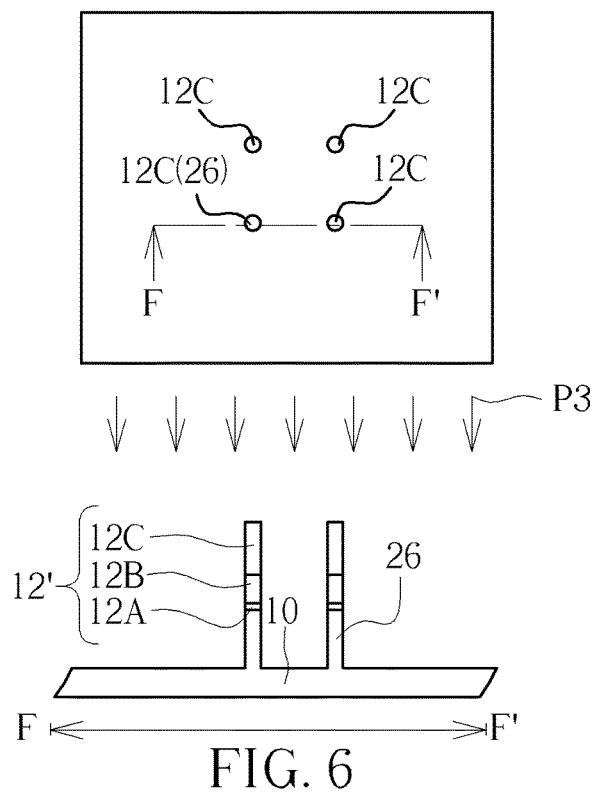
FIG. 6 shows the top view diagram and the cross section diagram after a third etching process is performed.
Figure 7:
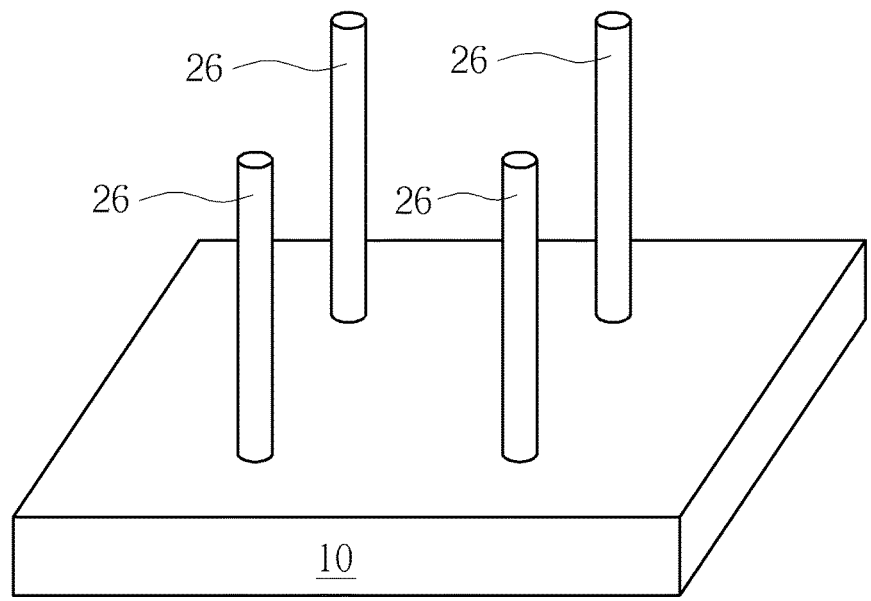
FIG. 7 shows the schematic diagram of the nanowire structures according to one embodiment of the present invention.

As shown in FIG. 6, the upper portion of FIG. 6 shows the top view diagram after a third etching process is performed, the lower portion of FIG. 6 shows the cross section diagram according to the cross section line F-F' of the upper portion of FIG. 6. After the nanowire hard masks 24 are formed, a third etching process P3 is then performed, and each nanowire hard mask 24 is used as a protective layer, and the cap layer 12 and the substrate 10 are then etched, so as to remove parts of the cap layer 12 (the rest of the cap layers are defined as the cap layers 12'), and the pattern of the nanowire hard masks 24 is transferred into the substrate 10. Next, as shown in FIG. 7, FIG. 7 shows the schematic diagram of the nanowire structures of the present invention, after the cap layers 12' are removed, where the structures disposed on the substrate 10 are defined as a plurality of nanowire structures 26.

It is noteworthy that, the nanowire structures 26 of the present invention are formed by transferring the pattern of the nanowire hard masks 24 into the substrate 10, therefore, the size of each nanowire structure 26 should equal to the size of each nanowire hard mask 24. In other words, the diameter of the nanowire structures 26 is about 8-12 nanometers, and the distance (gap) between two adjacent nanowire structures 26 is about 23-28 nanometers. The size mentioned above is much smaller than the critical dimension under the 14 nm manufacturing process technology. As mentioned above, under the 14 nm manufacturing process technology, one pattern is formed by the photolithography process. If the size of the pattern is smaller than the critical dimension, it's very likely to lead the pattern formed to have failure. Performing the method of the present invention can achieve the purpose of using the 14 nm manufacturing process technology to form the device with much smaller size or gaps than the critical dimension of 14 nm manufacturing process technology.

Figure 8:
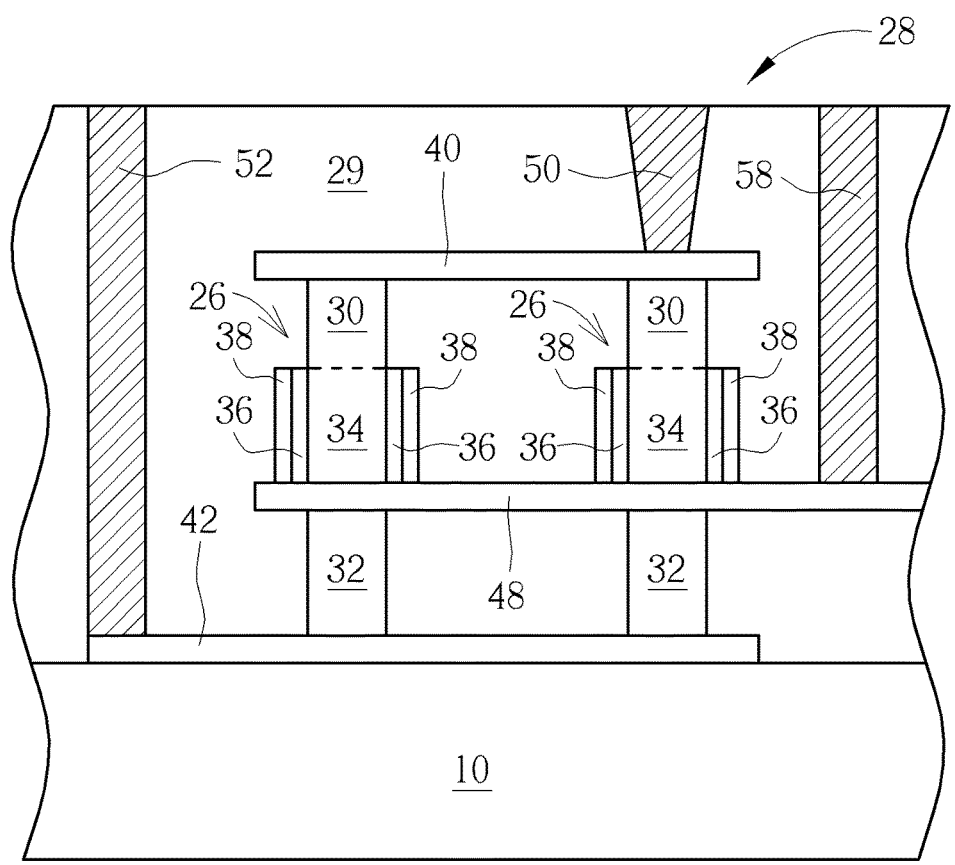
FIG. 8 shows the cross section diagram after the gate structure and the source/drain are formed.

FIG. 8 shows the cross section diagram after a gate structure and the source/drain are formed on the nanowire structures mentioned above. In the following steps, the nanowire structures 26 can be used for forming the vertical transistor. As shown in FIG. 8, the vertical transistor 28 includes a plurality of nanowire structures 26 disposed in a dielectric layer 29, and at least one source/drain 30 and at least one source/drain 32 can be formed through the ion implantation process or the solid-state-diffusion (SSD) process on the upper portion and the lower portion of each nanowire structure 26 respectively. The channel region 34 of the vertical transistor 28 is disposed between the source/drain 30 and the source/drain 32, a gate dielectric 36 and a gate electrode 38 are surrounding the outer surface of the channel region 34. In this vertical transistor 28, the source/drain 30 is electrically connected to a conductive layer 40, and the conductive layer 40 is electrically connected to a contact structure 50; the source/drain 32 is electrically connected to a conductive layer 42, and the conductive layer 42 is electrically connected to a contact structure 52; the gate electrode 38 surrounds each nanowire structure 26, and is electrically connected to a conductive layer 48, and the conductive layer 48 is electrically connected to a contact structure 58. Therefore, the vertical transistor 28 is a gate-all-around nanowire transistor, having the advantages such as high drive current and minimizing short-channel effects. The processes for forming the gate structure and the source/drain mentioned above are well known to those skilled in the art, and will not be described in detail here.

Figure 9:
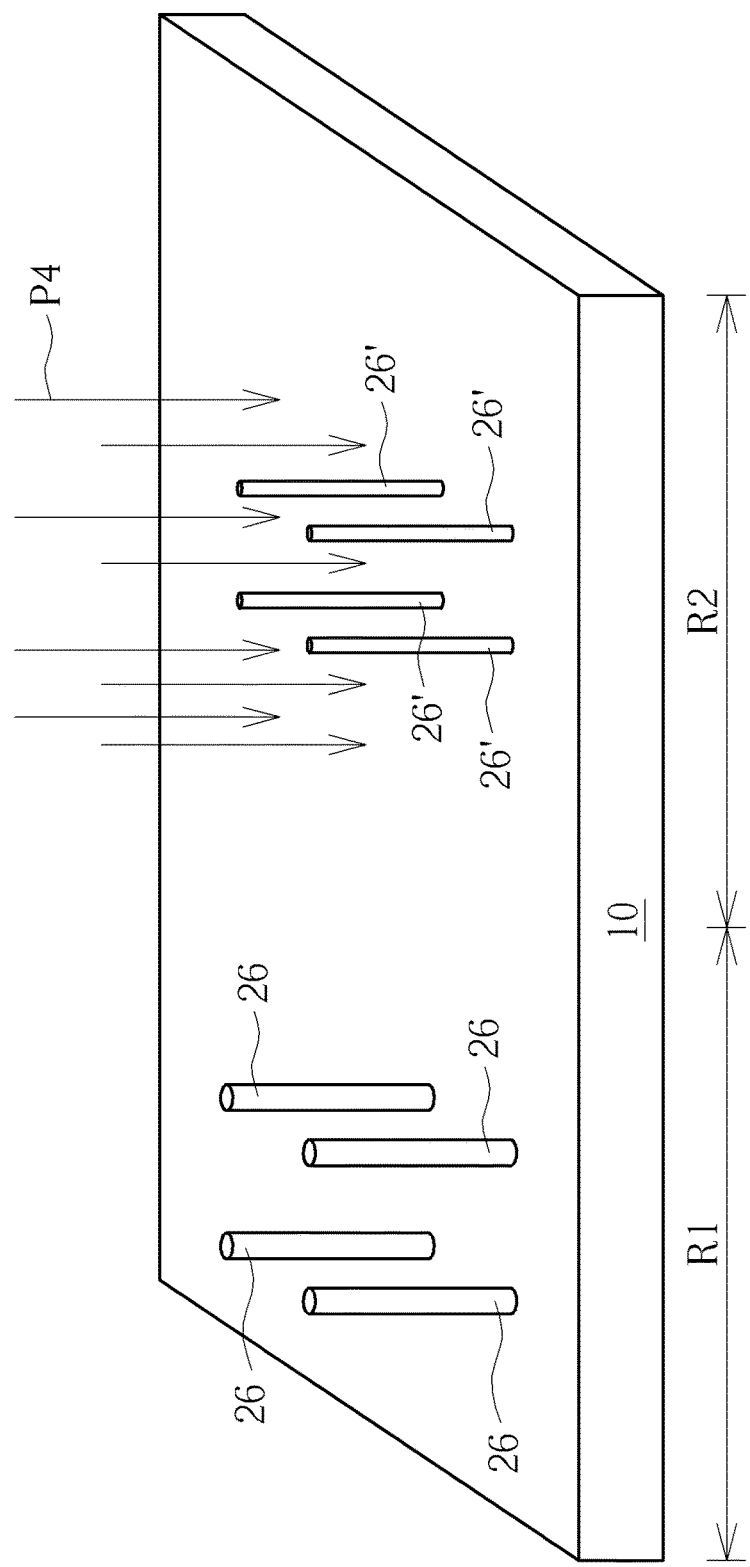
FIG. 9 shows the schematic diagram of the nanowire structures according to another embodiment of the present invention.

FIG. 9 shows the schematic diagram of the semiconductor structure according to another embodiment of the present invention. As mentioned above, the present invention may include more than one pattern groups, by performing the processes in the first preferred embodiment, including forming the spacers, forming the photoresist layer, performing the first etching process, performing the second etching process and performing the third etching process. After the steps mentioned above are formed, more than one nanowire groups can be formed (for example, each nanowire group include four nanowire structures). However, in this embodiment, however, the sacrificial patterns in different groups may have different sizes, so after the manufacturing process is performed, the nanowire structures with different sizes can be formed. As shown in FIG. 9, in this embodiment, not only are the nanowire structures 26 formed within a first region R1, the nanowire structures 26' are further formed within a second region R2. In addition, a fourth etching process P4 can be further performed to the nanowire structures 26', the fourth etching process P4 such as an oxidation process, an epitaxial process or an etching process, so as to increase or to trim the size of the nanowire structures 26' (FIG. 9 trims the size of the nanowire structures 26' as an example). Therefore, the size of the nanowire structures 26 and the size of the nanowire structures 26' are different, and they may be used for forming different vertical transistors in other steps.

The key feature of the present invention is using the current 14 nm manufacturing process technology to form the nanowire group (each one nanowire group includes four nanowire structures), in which the size or the gaps of the nanowire structures is much smaller than the critical dimension of 14 nm manufacturing process technology. In this invention, it is not necessary to use other complex or high cost processes (such as E-beam), but still trims the size of the nanowires easily.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method for forming a semiconductor structure, at least comprising:
  forming four sacrificial patterns on a substrate;
  forming four annular-shaped spacers on the sidewalls of the four sacrificial patterns respectively, wherein a star-shaped region is defined between the four annular-shaped structures;
  removing the four sacrificial patterns;
  forming a photoresist layer among each of the four annular-shaped spacers, covering parts of each of the four annular-shaped spacers, wherein the photoresist layer entirely covers the star-shaped region;
  performing a first etching process, to partially remove each of the four annular-shaped spacers;
  removing the photoresist layer; and
  performing a second etching process, to remove each of the four annular-shaped spacers again, and to form four nanowire hard masks.

2. The method of claim 1, further comprising forming a cap layer between the substrate and the four sacrificial patterns.

3. The method of claim 2, wherein the cap layer is a multiple layer structure.

4. The method of claim 1, wherein the four sacrificial patterns are arranged in an array.

5. The method of claim 4, wherein each sacrificial pattern is a cylinder structure.

6. The method of claim 5, wherein the diameter of each sacrificial pattern is between 30-35 nanometers.

7. The method of claim 5, wherein a distance between each one of the four sacrificial patterns to another adjacent sacrificial pattern of the four sacrificial patterns is between 48-55 nanometers.

8. The method of claim 1, wherein the four annular-shaped structures are arranged in an array.

9. The method of claim 8, wherein after the four sacrificial patterns are removed, four blank regions are formed, and the positions of the four blank regions correspond to the positions of the four sacrificial patterns.

10. The method of claim 9, wherein the photoresist layer does not cover the four blank regions.

11. The method of claim 1, wherein the four nanowire hard masks comprise cylinder structures, and the diameter of each nanowire hard mask is between 8-12 nanometers.

12. The method of claim 11, wherein a distance between each one of the four nanowire hard masks to another adjacent nanowire hard mask of the four nanowire hard masks is between 23-28 nanometers.

13. The method of claim 1, wherein the second etching process comprises multiple etching process steps.

14. The method of claim 1, further comprising performing a third etching process, to transfer the pattern of each nanowire hard mask to the substrate, and to form a plurality of nanowire structures.

15. The method of claim 14, wherein after the plurality of nanowire structures are formed, further comprising performing a fourth etching process, to remove parts of each nanowire structure.

16. The method of claim 14, further comprising forming at least one source and at least drain connected to the plurality of nanowire structures.

17. The method of claim 14, further comprising forming at least one gate structure connected to the plurality of nanowire structures.

18. The method of claim 14, further comprising forming a plurality of second nanowire structures, a diameter of each second nanowire structure being different from a diameter of each nanowire structure.

* * * * *